United States Patent
Natori et al.

(10) Patent No.: US 7,190,015 B2
(45) Date of Patent: Mar. 13, 2007

(54) SEMICONDUCTOR DEVICE AND METHOD OF MANUFACTURING THE SAME

(75) Inventors: Katsuaki Natori, Yokohama (JP); Koji Yamakawa, Tokyo (JP); Hiroyuki Kanaya, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/878,051

(22) Filed: Jun. 29, 2004

(65) Prior Publication Data

US 2005/0181559 A1    Aug. 18, 2005

(30) Foreign Application Priority Data

Feb. 16, 2004    (JP) .............................. 2004-037560

(51) Int. Cl.
*H01L 27/108* (2006.01)

(52) U.S. Cl. ............................... 257/306; 257/E29.342

(58) Field of Classification Search ........ 257/295–300, 257/276, 758, 760, E27.009, E27.046, E27.048, 257/E27.071, E29.001, E29.342, 306, 528, 257/532; 438/3, 240, 622–688, 381, 393, 438/396

See application file for complete search history.

(56) References Cited

U.S. PATENT DOCUMENTS

| 6,242,299 | B1 * | 6/2001 | Hickert | 438/240 |
|---|---|---|---|---|
| 6,249,014 | B1 * | 6/2001 | Bailey | 257/295 |
| 6,528,368 | B1 * | 3/2003 | Park | 438/253 |
| 6,570,203 | B2 * | 5/2003 | Hikosaka et al. | 257/295 |
| 6,611,014 | B1 | 8/2003 | Kanaya et al. | |
| 6,627,462 | B1 * | 9/2003 | Yang et al. | 438/3 |
| 6,706,540 | B2 * | 3/2004 | Hikosaka et al. | 438/3 |
| 6,998,275 | B2 * | 2/2006 | Zhao et al. | 438/3 |
| 2001/0006239 | A1 * | 7/2001 | Yang et al. | 257/296 |
| 2003/0006439 | A1 * | 1/2003 | Bailey | 257/295 |
| 2003/0089954 | A1 * | 5/2003 | Sashida | 257/369 |
| 2004/0140493 | A1 * | 7/2004 | Yoshikawa et al. | 257/295 |
| 2004/0159874 | A1 * | 8/2004 | Tsuchiya et al. | 257/306 |

FOREIGN PATENT DOCUMENTS

| JP | 10-335458 | 12/1998 |
|---|---|---|
| JP | 2001-15698 | 1/2001 |
| JP | 2001-15703 | 1/2001 |
| JP | 2001-291843 | 10/2001 |
| JP | 2002-26286 | 1/2002 |
| JP | 2002-33460 | 1/2002 |
| JP | 2002-76296 | 3/2002 |

* cited by examiner

*Primary Examiner*—Scott B. Geyer
(74) *Attorney, Agent, or Firm*—Oblon, Spivak, McClelland, Maier & Neustadt, P.C.

(57) ABSTRACT

A semiconductor device including a semiconductor substrate, a capacitor formed above the semiconductor substrate, a first interlayer insulating film formed above the capacitor and having a trench, a wiring formed above the capacitor and formed in the trench, the wiring have a top surface flush with a top surface of the first interlayer insulating film, a first hydrogen barrier film formed in contact with the top surface of the wiring and the top surface of the first interlayer insulating film and preventing hydrogen from diffusing into the capacitor and a second interlayer insulating film formed on the first hydrogen barrier film.

14 Claims, 7 Drawing Sheets

SEMICONDUCTOR DEVICE AND METHOD OF MANUFACTURING THE SAME

CROSS-REFERENCE TO RELATED APPLICATIONS

This application is based upon and claims the benefit of priority from prior Japanese Patent Application No. 2004-037560, filed Feb. 16, 2004, the entire contents of which are incorporated herein by reference.

BACKGROUND OF THE INVENTION

1. Field of the Invention

The present invention relates to a semiconductor device and a method of manufacturing the semiconductor device.

2. Description of the Related Art

A ferroelectric memory using a ferroelectric film such as a $Pb(Zr_xTi_{1-x})O_3$ film (a PZT film) for a dielectric film of a capacitor, i.e., a FeRAM (ferroelectric random access memory) has recently been developed.

The ferroelectric memory has a problem that a capacitor decreases in characteristics and reliability because of a diffusion of hydrogen into the capacitor. For example, a step of patterning a capacitor film by RIE and a step of forming an interlayer insulating film by CVD after forming the capacitor are carried out in a gaseous atmosphere containing hydrogen. A hydrogen barrier film therefore needs to prevent hydrogen from diffusing. A conventional ferroelectric memory had two problems because no adequate measures were taken against a diffusion of hydrogen.

The first problem is as follows. A silicon nitride film is known as one hydrogen barrier film (see Jpn. Pat. Appln. KOKAI Publication No. 2001-15698, for example). Conventionally a silicon nitride film was formed in a gaseous atmosphere containing hydrogen such as $SiH_4$ and thus a diffusion of the hydrogen caused a problem.

The second problem is as follows. Conventionally a hydrogen barrier film was formed chiefly only around a capacitor. To form a hydrogen barrier film only around a capacitor is not always adequate measures against a diffusion of hydrogen because the hydrogen barrier film cannot shut off the hydrogen completely. A ferroelectric memory generally has a multilevel interconnect structure that is obtained by repeatedly forming an interlayer insulating film and a wiring layer after a capacitor is formed. Since most interlayer insulating films are formed in a gaseous atmosphere containing hydrogen, it is necessary to take measures to effectively prevent the hydrogen from diffusing. Jpn. Pat. Appln. KOKAI Publication No. 2001-15703 discloses a structure in which a hydrogen barrier film is formed between interlayer insulating films. However, the structure of the Publication aims at resolving a problem with hydrogen annealing and takes into no consideration a diffusion of hydrogen occurring when an interlayer insulating film is formed in a multilevel interconnect structure. It is thus difficult to exactly prevent a diffusion of hydrogen due to the formation of interlayer insulating films.

As described above, conventionally, no adequate measures were taken against a diffusion of hydrogen. No capacitors that improved in characteristics and reliability were difficult to achieve.

BRIEF SUMMARY OF THE INVENTION

A method of manufacturing a semiconductor device according to a first aspect of the present invention, comprises: forming a bottom electrode film of a capacitor above a semiconductor substrate; forming a dielectric film of the capacitor on the bottom electrode film; forming a top electrode film of the capacitor on the dielectric film; and forming a hydrogen barrier film after forming the top electrode film, the hydrogen barrier film preventing hydrogen from diffusing into the dielectric film, wherein forming the hydrogen barrier film includes forming an oxide film containing silicon and nitriding the oxide film.

A semiconductor device according to a second aspect of the present invention, comprises: a semiconductor substrate; a capacitor formed above the semiconductor substrate; a wiring formed above the capacitor; a first hydrogen barrier film formed in contact with a top surface of the wiring and preventing hydrogen from diffusing into the capacitor; and an interlayer insulating film formed on the first hydrogen barrier film.

DETAILED DESCRIPTION OF THE INVENTION

Embodiments of the present invention will now be described with reference to the accompanying drawings.

(First Embodiment)

FIGS. 1 to 7 are sectional views schematically showing a method of manufacturing a semiconductor device according to a first embodiment of the present invention.

Figure 1:
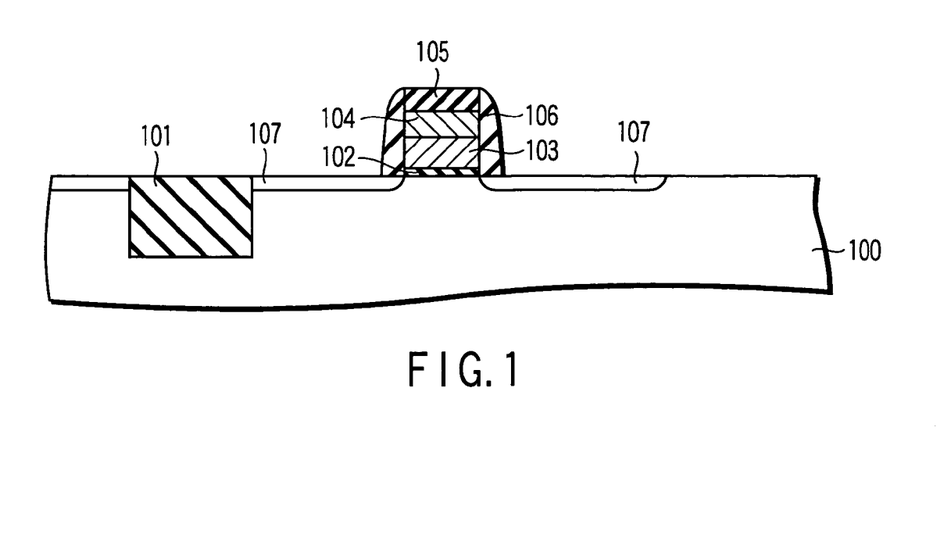
FIGS. 1 to 7 are sectional views schematically showing a method of manufacturing a semiconductor device according to a first embodiment of the present invention.

Referring first to FIG. 1, an isolation region 101 having an STI (shallow trench isolation) structure is formed on a p-type silicon substrate (semiconductor substrate) 100. A MIS transistor is formed as follows.

A silicon oxide film having a thickness of about 6 nm is formed as a gate insulating film 102 by thermal oxidation. An arsenic-doped n$^+$-type polysilicon film 103 is formed on the gate insulating film 102. A $WSi_x$ film 104 is formed on the polysilicon film 103, and a silicon nitride film 105 is formed on the $WSi_x$ film 104. The films 103, 104 and 105 are processed by normal photolithography and RIE (reactive ion etching) to form a gate electrode. A silicon nitride film 106 is deposited on the entire surface of the resultant structure. A side wall spacer is formed of the silicon nitride film 106 on either side wall of the gate electrode by RIE. Though a detailed description is omitted, source and drain regions 107 are formed by ion implantation and heat treatment in the step shown in FIG. 1.

Figure 2:
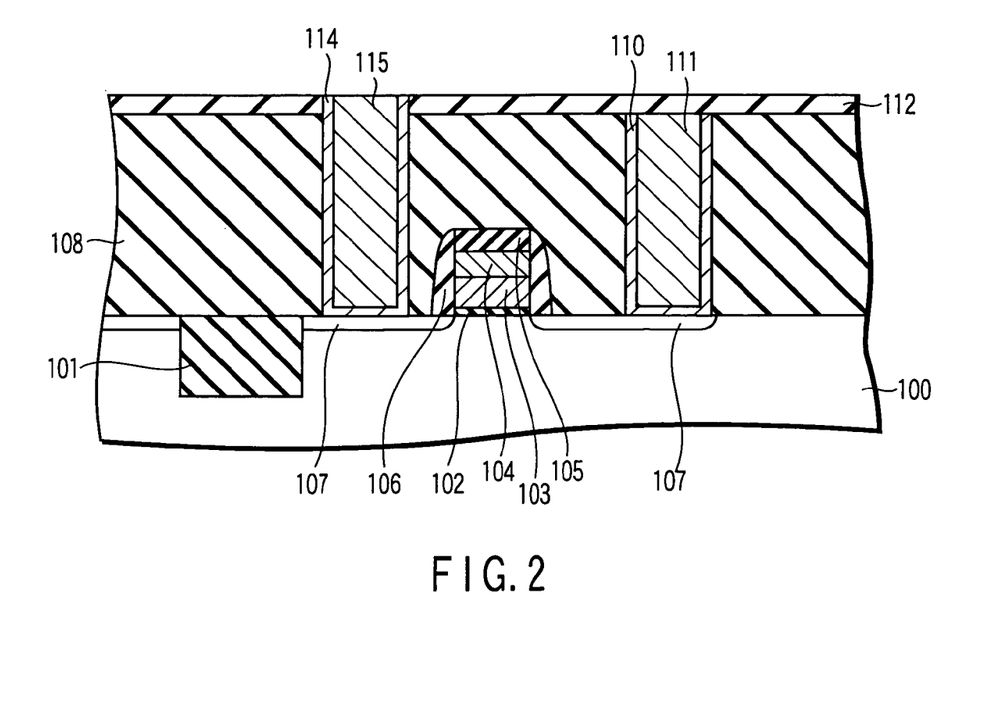

Referring to FIG. 2, a silicon oxide film 108 is deposited on the entire surface of the resultant structure by CVD (chemical vapor deposition) and then flattened by CMP (chemical mechanical polishing). A contact hole is formed in the silicon oxide film 108 to reach one of the source and drain regions 107. A titanium film is deposited by sputtering or CVD. The titanium film is nitrided by heat treatment in forming gas to form a TiN film 110. A tungsten film 111 is deposited by CVD. The TiN film 110 and tungsten film 111 are removed by CMP, except in the contact hole. A plug is thus formed in contact with one of the source and drain regions 107.

A silicon nitride film 112 is deposited on the entire surface of the resultant structure by CVD. Another contact hole is formed to reach the other of the source and drain regions 107. By the same method as described above, a TiN film 114 and a tungsten film 115 are formed in the contact hole. A plug is thus formed in contact with the other of the source and drain regions 107.

Figure 3:
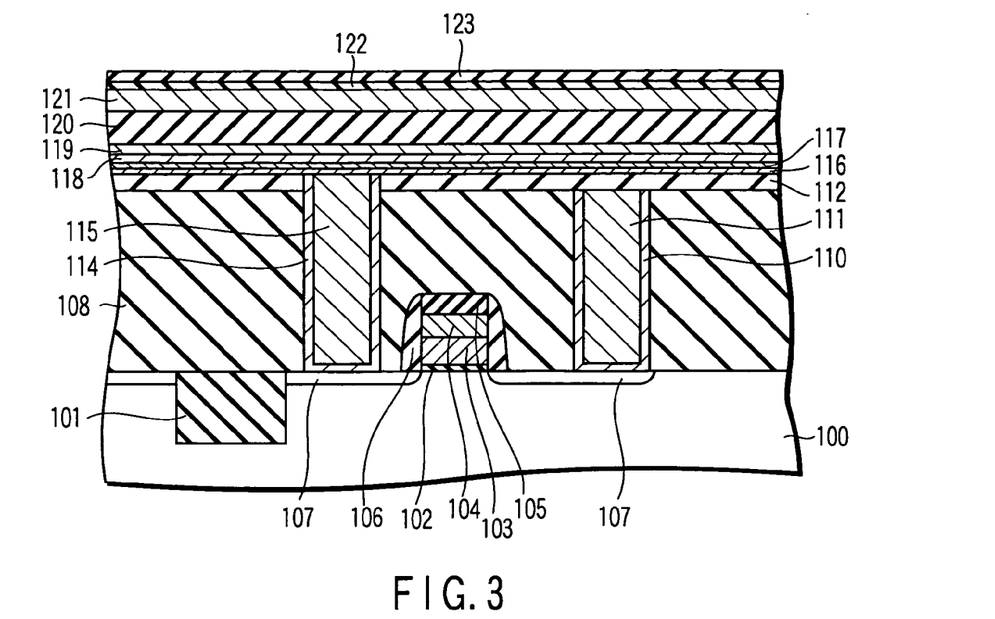

Referring to FIG. 3, a silicon carbide film 116 having a thickness of about 10 nm is deposited by sputtering. A titanium (Ti) film 117 having a thickness of about 3 nm is deposited by sputtering. An iridium (Ir) film 118 having a thickness of about 30 nm and a platinum (Pt) film 119 having a thickness of about 20 nm are deposited in sequence as a bottom electrode film of a capacitor by sputtering. A $Pb(Zr_xTi_{1-x})O_3$ film (PZT film) 120 having a perovskite structure is formed as a dielectric film (ferroelectric film) of the capacitor. More specifically, a PZT film is deposited by sputtering and then crystallized by RTA (rapid thermal annealing) in an atmosphere of oxygen. A platinum film 121 is deposited as a top electrode film of the capacitor by sputtering.

A silicon oxynitride (SiON) film 122 is formed on the platinum film 121 as a hydrogen barrier film. The film 122 is done as follows. First, a silicon oxide film (an oxide film containing silicon) having a thickness of about 5 nm is deposited by CVD using TEOS (tetraethoxysilane) and ozone ($O_3$) as source gas. Then, a silicon oxide film is nitrided using helicon wave plasma in an atmosphere of nitrogen ($N_2$) gas to form a silicon oxynitride film 122. The plasma power for forming the film 122 is, for example, about 100 W. The whole silicon oxide film need not always be nitrided, nor need be the lower region of the silicon oxide film.

The hydrogen permeability of the silicon oxynitride film 122 is lower than that of the silicon oxide film and the like. Hydrogen can thus effectively be prevented from diffusing into the PZT film 120 in a step in an atmosphere including hydrogen, such as a step of patterning by RIE and a step of forming an interlayer insulating film by CVD. Since a silicon oxide film is nitrided using gas containing nitrogen and not hydrogen, the problem that hydrogen included in a gaseous atmosphere diffuses can be prevented from occurring. Normal plasma nitriding using nitrogen gas is difficult to perform sufficiently because the density of a nitrogen radical is generally low. Since the nitriding using helicon wave plasma allows a high-density nitrogen radical to be generated, it can adequately be performed. Since a silicon oxide film is formed by TEOS and $O_3$, damage to the deposition can be reduced.

A silicon oxide film 123 is deposited on the silicon oxynitride film 122 by CVD.

Figure 4:
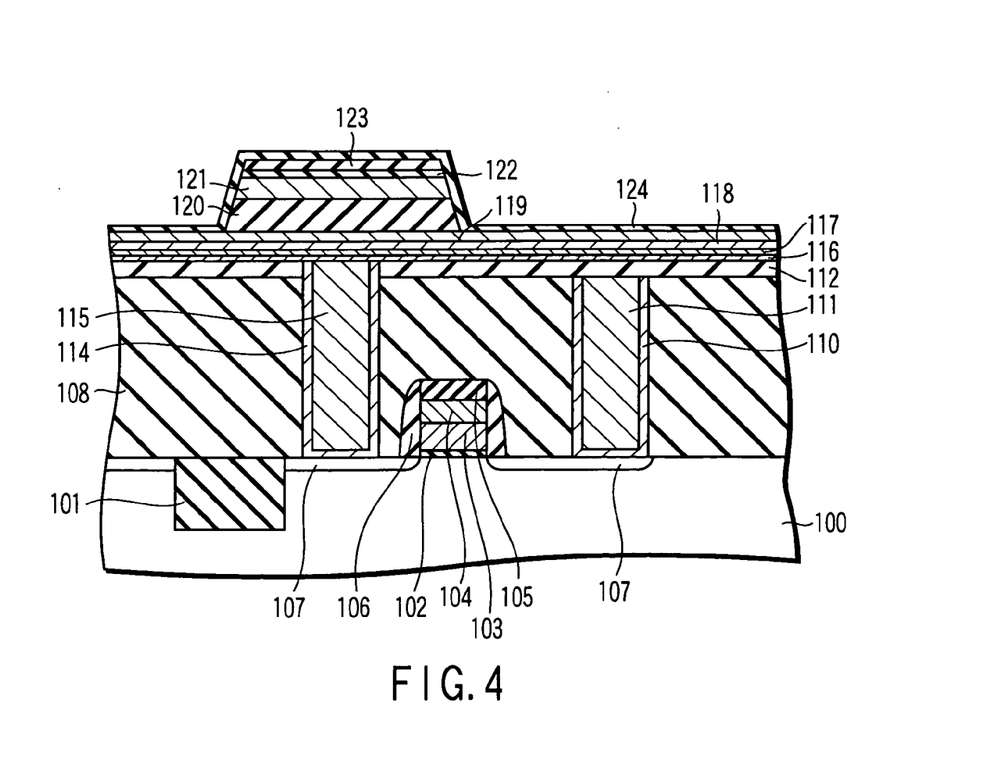

The silicon oxide film 123 is patterned by photo-lithography and RIE as shown in FIG. 4. The silicon oxynitride film 122, platinum film 121 and PZT film 120 are etched by RIE using the patterned silicon oxide film 123 as a mask. Then, a silicon oxynitride film 124 having a thickness of about 10 nm is formed as a hydrogen barrier film. The method of forming the silicon oxynitride film 124 is the same as the above-described method of forming the silicon oxynitride film 122.

Figure 5:
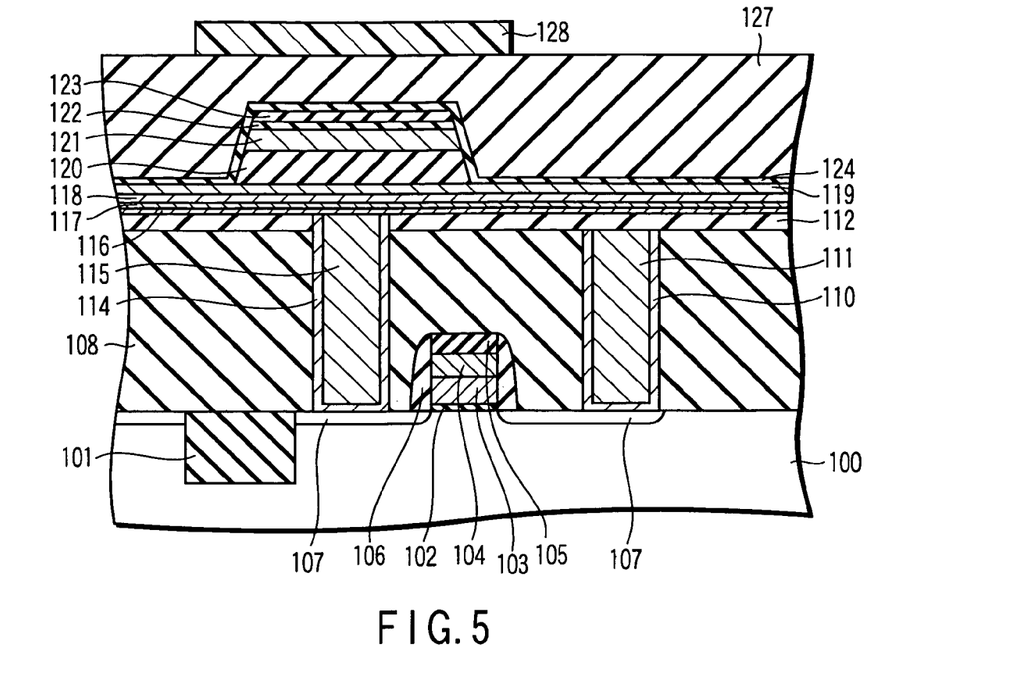

A silicon oxide film 127 is deposited by CVD as shown in FIG. 5. A photoresist pattern 128 is formed on the silicon oxide film 127 by photolithography.

Figure 6:
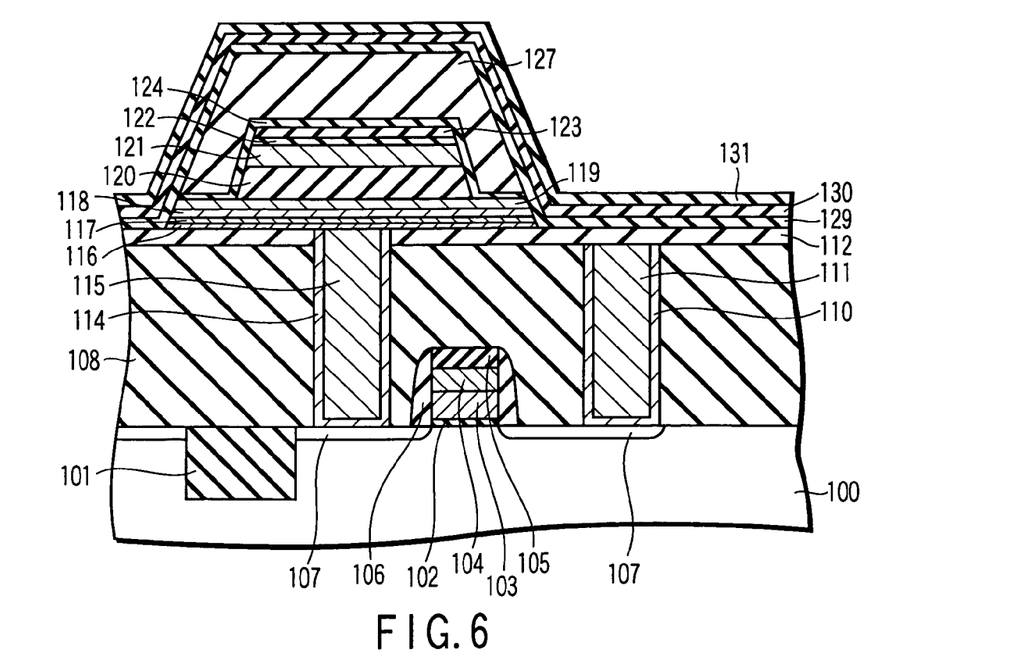

The silicon oxide film 127 is patterned using the photoresist pattern 128 as a mask as shown in FIG. 6. The silicon oxynitride film 124, platinum film 119, iridium film 118, titanium film 117 and silicon carbide film 116 are patterned by RIE using the patterned silicon oxide film 127 as a mask.

The bottom electrode of the iridium film 118 and platinum film 119, the dielectric portion of the PZT film 120, and the top electrode of the platinum film 121 make up a ferroelectric capacitor.

Figure 7:
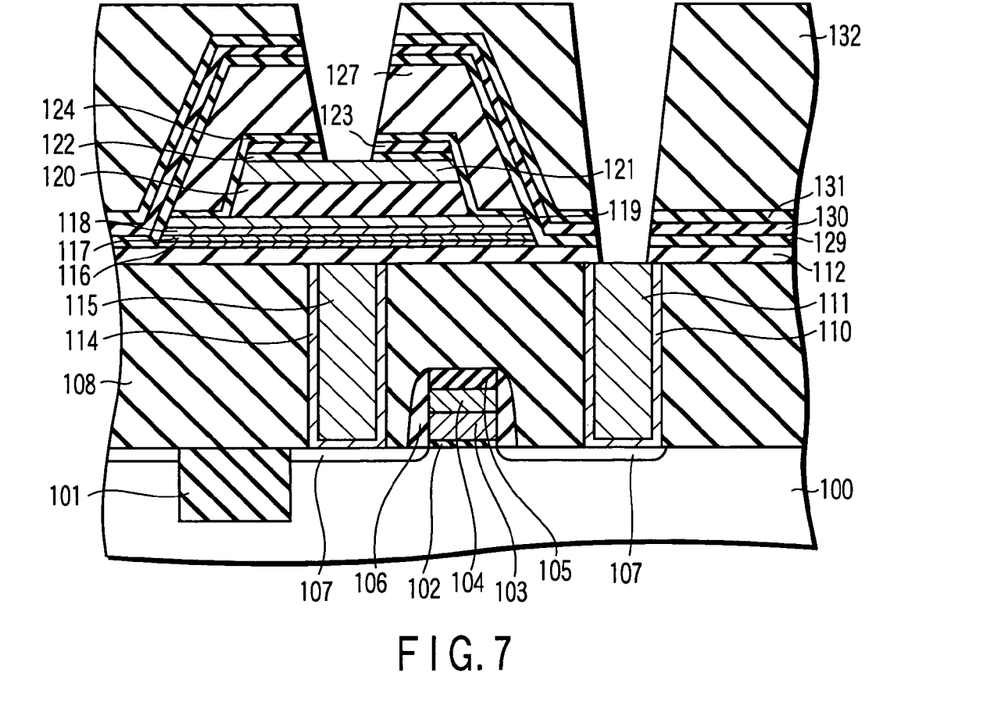

Referring to FIG. 7, a silicon oxynitride film 129 having a thickness of about 10 nm is formed as a hydrogen barrier film on the entire surface of the resultant structure. The method of forming the film 129 is the same as the above-described method of forming the silicon oxynitride film 122. A silicon oxide film 130 having a thickness of about 50 nm is deposited by CVD. A silicon oxynitride film 131 having a thickness of about 10 nm is formed as a hydrogen barrier film. The method of forming the film 131 is the same as the above-described method of forming the silicon oxynitride film 122.

A silicon oxide film 132 is deposited on the entire surface of the resultant structure by CVD and then flattened by CMP. The silicon oxide film 132 is patterned by photolithography and RIE to form a contact hole reaching the platinum film 121 and a contact hole reaching the tungsten plug 111. In order to recover the damage caused on the PZT film 120 at the time of etching, the structure is thermally treated at a temperature of about 600° C. in an atmosphere of oxygen.

Though the subsequent steps are not shown, a plug is formed in each of the contact holes, drive and bit lines are formed, a metal wiring is formed, etc. Thus, a ferroelectric memory having a COP (capacitor on plug) structure is completed.

According to the first embodiment described above, when a hydrogen barrier film is formed, a silicon oxide film is formed and then nitrided to form a silicon oxynitride film. Hydrogen can thus effectively be prevented from diffusing into a capacitor dielectric film. In particular, if a silicon oxide film is nitrided using gas including nitrogen and not hydrogen, a problem that hydrogen included in a gaseous atmosphere diffuses can be prevented. With the first embodiment, a capacitor that improves in characteristics and reliability can be obtained.

The step of forming a hydrogen barrier film (silicon oxynitride film) can be performed in any stage if it is done after the step of forming a top electrode film. In other words, a hydrogen barrier film can be formed before the step of patterning the top electrode film like the silicon oxynitride film 122 or after the step of doing the same like the silicon oxynitride film 124. A hydrogen barrier film can also be formed after the top electrode film, dielectric film and bottom electrode film are patterned to form a capacitor structure, like the silicon oxynitride films 129 and 131.

In the first embodiment, a PZT film is used as a dielectric film of a capacitor. A ferroelectric film such as a $SrBi_2Ta_2O_9$ (SBT) film can be used as the dielectric film. In the first embodiment, a platinum (Pt) film and an iridium (Ir) film are used as a bottom electrode film of a capacitor and a platinum (Pt) film is used as a top electrode film thereof. A ruthenium (Ru) film, an $SrRuO_3$ (SRO) film, etc. can be used as an electrode film.

(Second Embodiment)

FIGS. 8 to 12 are sectional views schematically showing a method of manufacturing a semiconductor device according to a second embodiment of the present invention. The steps precedent to the step of forming a capacitor are the same as those shown in FIGS. 1 and 2 of the first embodiment.

Figure 8:
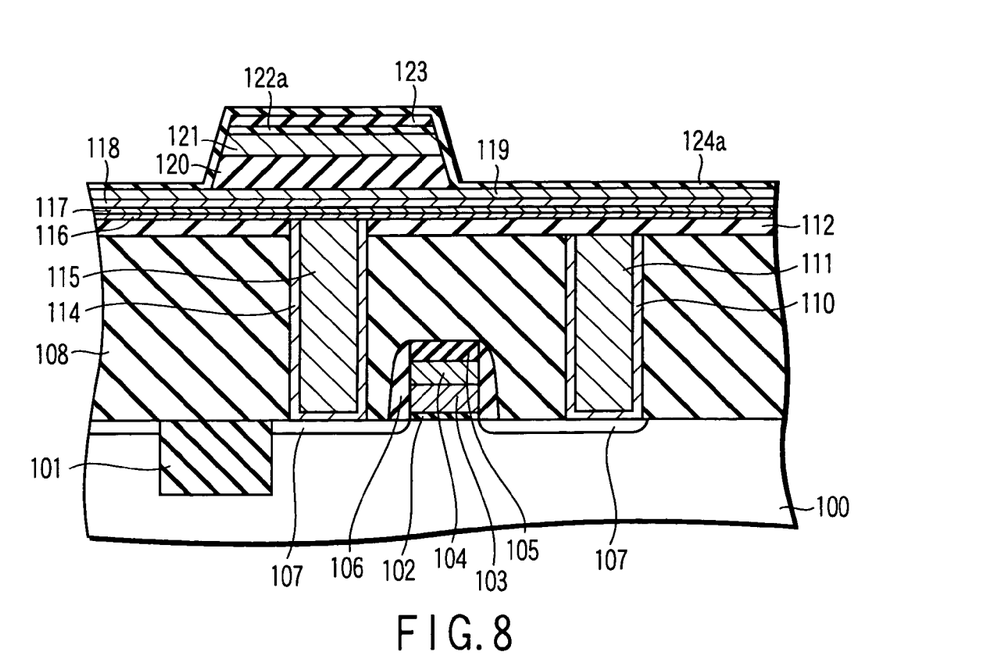
FIGS. 8 to 12 are sectional views schematically showing a method of manufacturing a semiconductor device according to a second embodiment of the present invention.

After the step shown in FIG. 2 of the first embodiment, a silicon carbide film 116 having a thickness of about 10 nm is deposited by sputtering as shown in FIG. 8. A titanium (Ti) film 117 having a thickness of about 3 nm is deposited by sputtering. An iridium (Ir) film 118 having a thickness of about 30 nm and a platinum (Pt) film 119 having a thickness of about 20 nm are deposited in sequence as a bottom electrode film of a capacitor by sputtering. A PZT film 120 having a perovskite structure is formed as a dielectric film (ferroelectric film) of the capacitor. More specifically, a PZT film is deposited by sputtering and then crystallized by RTA in an atmosphere of oxygen. A platinum film 121 is deposited as a top electrode film of the capacitor by sputtering.

An aluminum oxide ($Al_2O_3$) film 122a having a thickness of about 5 nm is formed as a hydrogen barrier film on the platinum film 121 by sputtering. The hydrogen permeability of the aluminum oxide film 122a is lower than that of the silicon oxide film and the like. Hydrogen can thus effectively be prevented from diffusing into the PZT film 120 in a step in an atmosphere including hydrogen, such as a step of patterning by RIE and a step of forming an interlayer insulating film by CVD.

A silicon oxide film 123 is deposited on the aluminum oxide film 122a by CVD and then patterned by photolithography and RIE. The aluminum oxide film 122a, platinum film 121 and PZT film 120 are etched by RIE using the patterned silicon oxide film 123 as a mask. An aluminum oxide film 124a having a thickness of about 10 nm is formed as a hydrogen barrier film at a temperature of about 200° C. by ALD (atomic layer deposition). The aluminum oxide film formed by ALD is more improved in step coverage, film-thickness controllability, and hydrogen block ability than that formed by sputtering. With the aluminum oxide film formed by ALD, a hydrogen barrier film that improves in preventing hydrogen from diffusing can be obtained.

Figure 9:
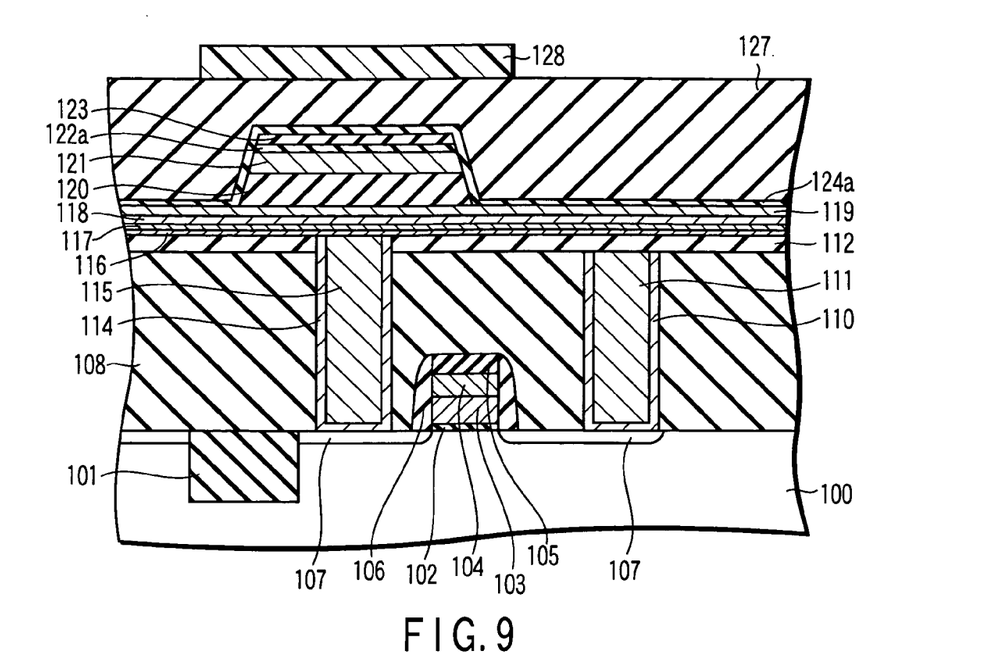

A silicon oxide film 127 is deposited by CVD as shown in FIG. 9. A photoresist pattern 128 is formed on the silicon oxide film 127 by photolithography.

Figure 10:
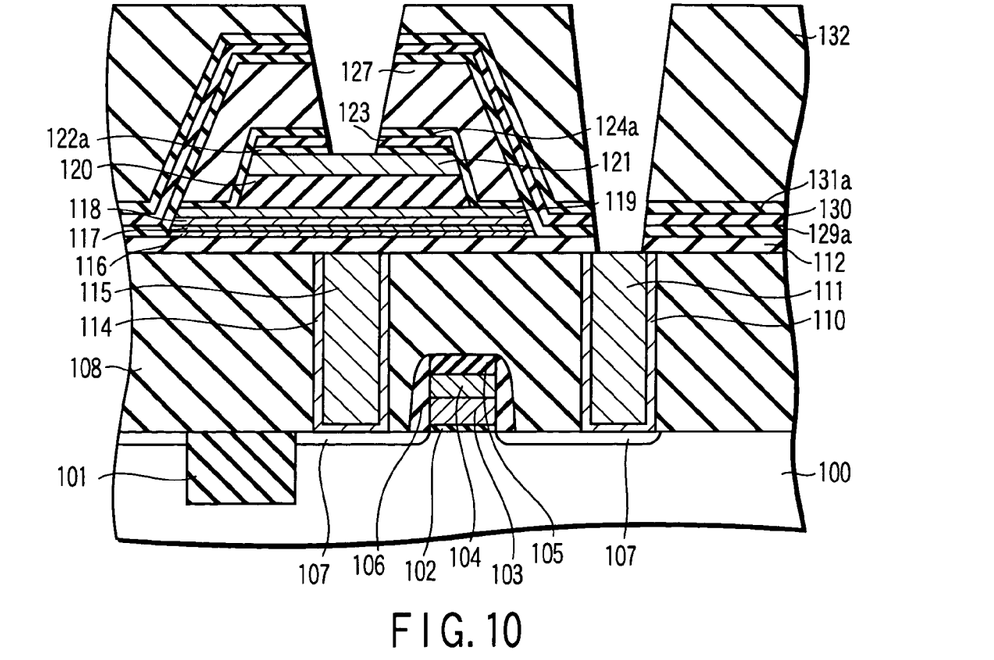

The silicon oxide film 127 is etched using the photoresist pattern 128 as a mask as shown in FIG. 10. The aluminum oxide film 124a, platinum film 119, iridium film 118, titanium film 117 and silicon carbide film 116 are patterned by RIE using the patterned silicon oxide film 127 as a mask.

The bottom electrode of the iridium film 118 and platinum film 119, the dielectric portion of the PZT film 120, and the top electrode of the platinum film 121 make up a ferroelectric capacitor.

An aluminum oxide film 129a having a thickness of about 10 nm is formed as a hydrogen barrier film at a temperature of about 200° C. by ALD. A silicon oxide film 130 having a thickness of about 50 nm is formed by CVD. An aluminum oxide film 131a having a thickness of about 10 nm is formed as a hydrogen barrier film.

A silicon oxide film 132 is deposited on the entire surface of the resultant structure by CVD and then flattened by CMP. The silicon oxide film 132 is patterned by photolithography and RIE to form a contact hole reaching the platinum film 121 and a contact hole reaching the tungsten plug 111. In order to recover the damage caused on the PZT film 120 at the time of etching, the structure is thermally treated at a temperature of about 600° C. in an atmosphere of oxygen.

Figure 11:
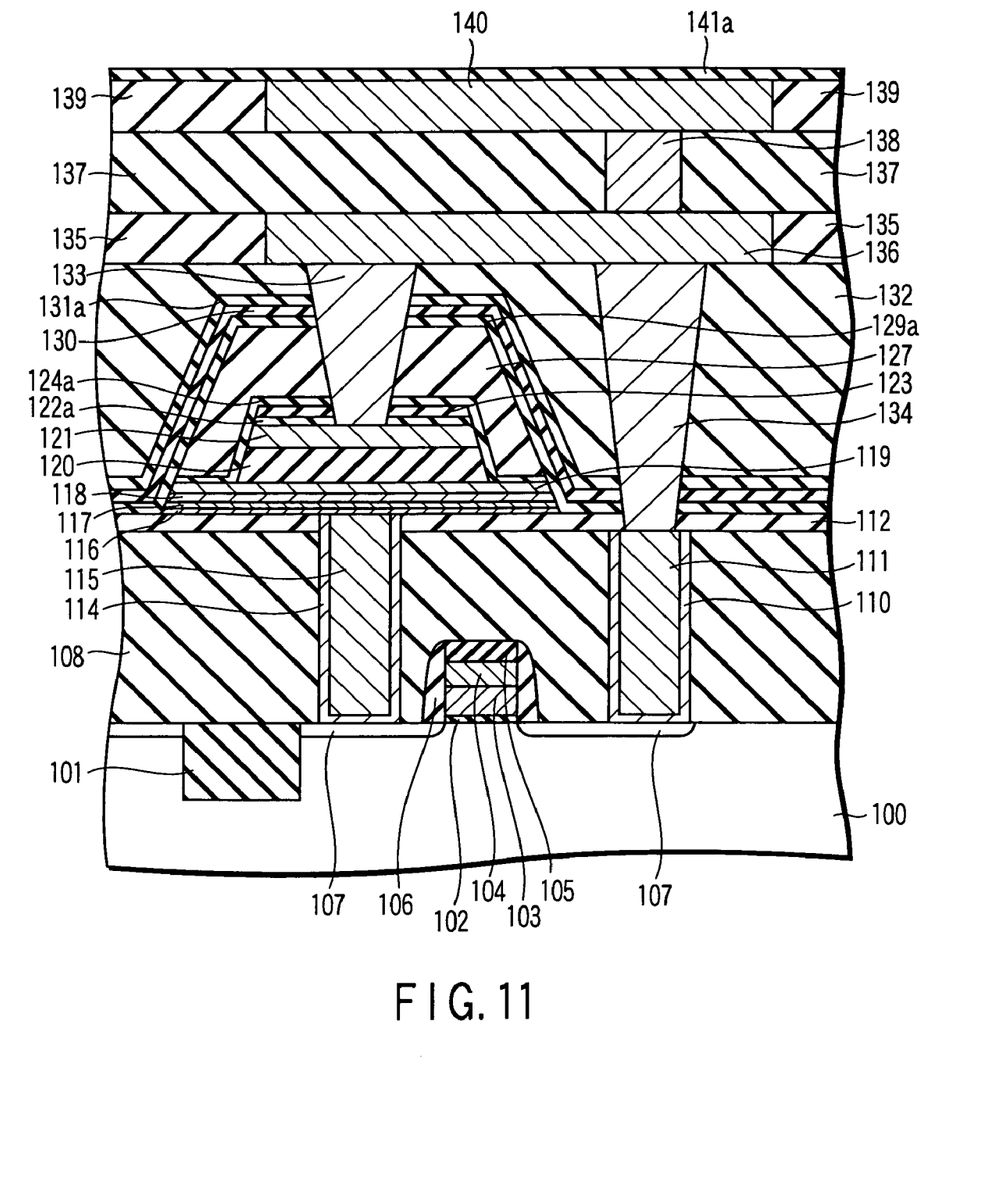

Contact plugs 133 and 134 are formed of aluminum in their respective contact holes as shown in FIG. 11. A silicon oxide film is formed on the entire surface of the resultant structure as an interlayer insulating film 135. A trench for wiring is formed in the interlayer insulating film 135 by RIE. An aluminum film is formed on the entire surface of the resultant structure and then flattened by CMP to form a wiring 136 of aluminum in the trench.

A silicon oxide film is formed as an interlayer insulating film 137 on the entire surface of the resultant structure and a via hole is formed in the film 137 by RIE. An aluminum film is formed on the entire surface of the resultant structure and then flattened by CMP to form a via plug 138 of the aluminum film in the via hole. A silicon oxide film is formed as an interlayer insulating film 139 on the entire surface of the resultant structure and a trench for wiring is formed in the film 139 by RIE. An aluminum film is formed on the entire surface of the resultant structure and then flattened by CMP to form a wiring 140 of aluminum in the trench.

An aluminum oxide ($Al_2O_3$) film 141a having a thickness of about 10 nm is formed as a hydrogen barrier film (first hydrogen barrier film) at a temperature of about 200° C. by ALD. The film 141a contacts the top surface of the interlayer insulating film 139 and the top surface of the wiring 140.

Figure 12:
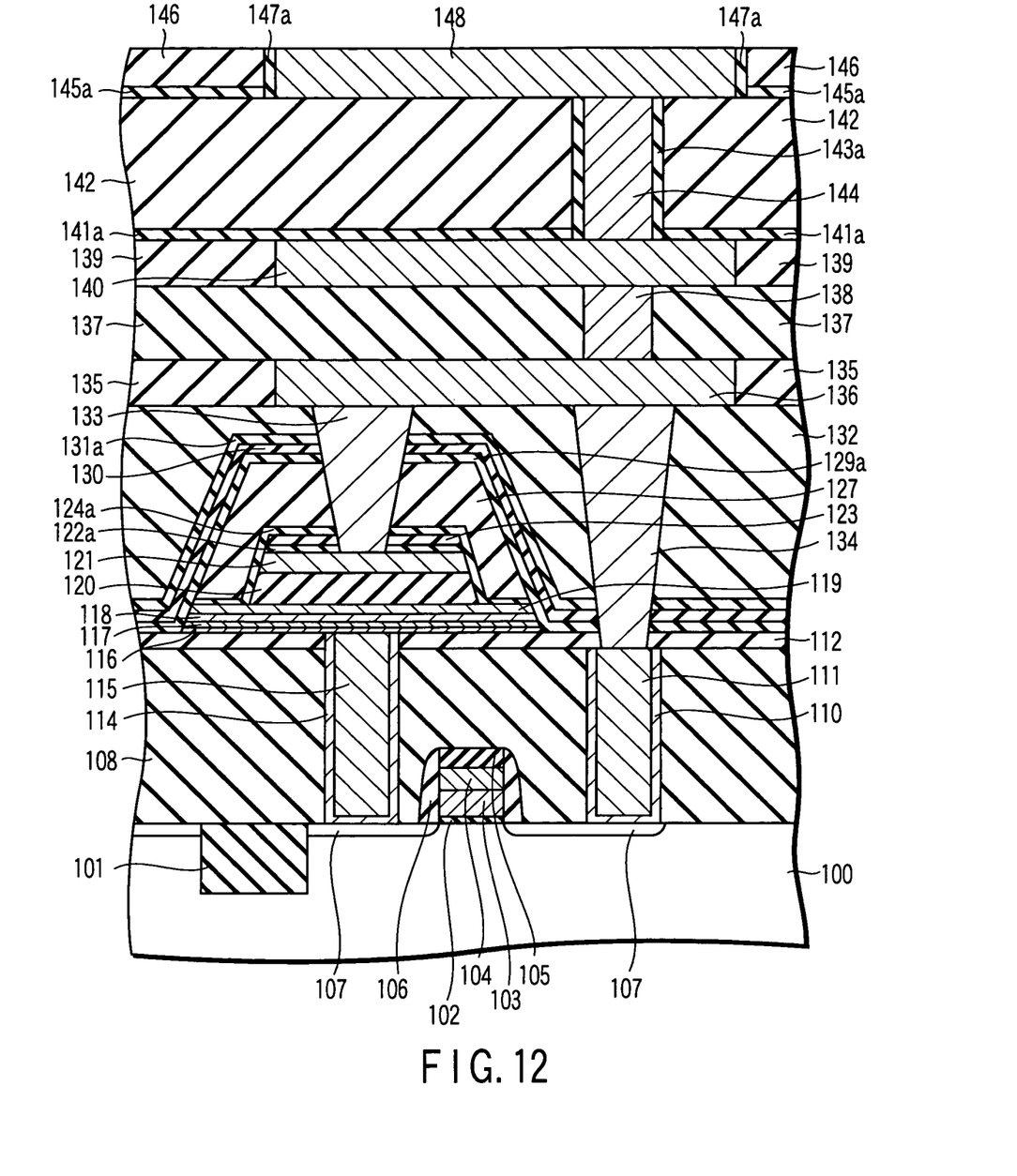

Referring to FIG. 12, a silicon oxide film is formed as an interlayer insulating film 142 on the entire surface of the resultant structure by CVD. Though the film 142 is formed in an atmosphere of gas containing hydrogen, the hydrogen can be prevented from diffusing downward because an aluminum oxide film 141a is formed on the interlayer insulating film 139 and wiring 140.

A multilevel interconnect structure is formed by repeatedly forming an interlayer insulating film and a wiring. The number of steps of forming an interlayer insulating film increases as the number of wirings does. The number of times of diffusion of hydrogen due to the formation of an interlayer insulating film in an atmosphere including hydrogen inevitably increases. Though the aluminum oxide film 131a and the like covers the capacitor structure, it cannot shut off the diffusion of hydrogen completely. As the number of wiring layers increases, damage to the capacitor caused by the diffusion of hydrogen when an interlayer insulating film is formed is gradually accumulated.

In the second embodiment, the aluminum oxide film 141a is formed in the step immediately after the wiring 140 is formed, or the step immediately before the interlayer insulating film 142 is done. If the wiring 140, interlayer insulating film 142 and aluminum oxide film 141a are formed in this order, hydrogen cannot be prevented from diffusing when the film 142 is formed. In the second embodiment, the aluminum oxide film 141a is formed immediately after the wiring 140 is formed (or the aluminum oxide film 141a contacts the top surface of the wiring 140). Hydrogen can thus effectively be prevented from diffusing when the interlayer insulating film 142 is formed.

After the interlayer insulating film 142 is formed, the interlayer insulating film 142 and aluminum oxide film 141a are etched by RIE to form a via hole. An aluminum oxide film 143a having a thickness of about 10 nm is formed as a hydrogen barrier film (second hydrogen barrier film) on the entire surface of the resultant structure at a temperature of about 200° C. by ALD. The aluminum oxide film 143a is left only on the side wall of the via hole by anisotropic etching using RIE. The aluminum oxide films 141a and 143a can reliably protect the lower part of the structure and effectively prevent hydrogen from diffusing. An aluminum film is formed on the entire surface of the resultant structure and then flattened by CMP to form a via plug 144 of the aluminum film in the via hole.

An aluminum oxide film 145a having a thickness of about 10 nm is formed as a hydrogen barrier film on the entire surface of the resultant structure at a temperature of about 200° C. by ALD. A silicon oxide film is formed as an interlayer insulating film 146 on the entire surface of the resultant structure. The films 145a and 146 are etched by RIE to form a trench for wiring. An aluminum oxide film 147a having a thickness of about 10 nm is formed as a hydrogen barrier film on the entire surface of the resultant structure at a temperature of about 200° C. by ALD. The film 147a is left only on the side wall of the trench by anisotropic etching using RIE. An aluminum film is formed on the entire surface of the resultant structure and then flattened by CMP to form a wiring 148 of aluminum in the trench.

Though the subsequent steps are not shown, an interlayer insulating film, a via plug and a wiring are formed repeatedly by the same method as described above. A ferroelectric memory having a multilevel interconnect structure is therefore completed.

According to the second embodiment described above, a hydrogen barrier film (aluminum oxide film) contacts the top surface of a wiring included in the multilevel interconnect structure. In other words, a hydrogen barrier film is formed immediately after a wiring is formed and an interlayer insulating film is formed immediately after the hydrogen barrier film is formed. Hydrogen can thus be prevented from diffusing when the interlayer insulating film is formed and effectively be prevented from diffusing into the capacitor. With the second embodiment, a capacitor that improves in characteristics and reliability can be obtained.

In the second embodiment, an aluminum oxide film is used as a hydrogen barrier film. A silicon nitride film and a silicon oxynitride film can be used as the hydrogen barrier film. If a silicon oxynitride film is used, a method of forming a silicon oxynitride film as described in the first embodiment can be adopted to effectively prevent hydrogen from diffusing into the capacitor when the silicon oxynitride film is formed.

In the second embodiment, no hydrogen barrier film (aluminum oxide film) is formed on the wiring 136. A hydrogen barrier film can be formed thereon like the hydrogen barrier film 141a on the wiring 140. A hydrogen barrier film can also be formed on the side surface of the plug 138 like the hydrogen barrier film 143a on the side surface of the plug 144.

In the second embodiment, a PZT film is used as a dielectric film of a capacitor. A ferroelectric film such as a $SrBi_2Ta_2O_9$ (SBT) film can be used. In the second embodiment, a platinum (Pt) film and an iridium (Ir) film are used as a bottom electrode film of a capacitor and a platinum (Pt) film is used as a top electrode film thereof. A ruthenium (Ru) film, a $SrRuO_3$ (SRO) film, etc. can be used as the electrode film.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
    a semiconductor substrate;
    a capacitor formed above the semiconductor substrate;
    a first interlayer insulating film formed above the capacitor and having a trench;
    a wiring formed above the capacitor and formed in the trench, the wiring have a top surface flush with a top surface of the first interlayer insulating film;
    a first hydrogen barrier film formed in contact with the top surface of the wiring and the top surface of the first interlayer insulating film and preventing hydrogen from diffusing into the capacitor; and
    a second interlayer insulating film formed on the first hydrogen barrier film.

2. The semiconductor device according to claim 1, further comprising:
    a plug connected to the wiring through the second interlayer insulating film; and
    a second hydrogen barrier film formed between the second interlayer insulating film and the plug and preventing hydrogen from diffusing into the capacitor.

3. The semiconductor device according to claim 2, wherein the second hydrogen barrier film is selected from an aluminum oxide film, a silicon nitride film and a silicon oxynitride film.

4. The semiconductor device according to claim 1, wherein the wiring is electrically connected to the capacitor.

5. The semiconductor device according to claim 1, further comprising a transistor formed on the semiconductor substrate and electrically connected to the capacitor.

6. The semiconductor device according to claim 1, wherein the first hydrogen barrier film is selected from an aluminum oxide film, a silicon nitride film and a silicon oxynitride film.

7. The semiconductor device according to claim 1, wherein a dielectric film of the capacitor includes a ferroelectric film.

8. A semiconductor device comprising:
    a semiconductor substrate;
    a capacitor formed above the semiconductor substrate;
    a wiring formed above the capacitor;
    a first hydrogen barrier film formed in contact with a top surface of the wiring and preventing hydrogen from diffusing into the capacitor; and
    an interlayer insulating film formed on the first hydrogen barrier film;
    a plug connected to the wiring through the interlayer insulating film, the plug being in contact with the wiring; and
    a second hydrogen barrier film formed between the interlayer insulating film and the plug and preventing hydrogen from diffusing into the capacitor.

9. The semiconductor device according to claim 8, wherein the wiring is electrically connected to the capacitor.

10. The semiconductor device according to claim 9, wherein the second hydrogen barrier film is selected from an aluminum oxide film, a silicon nitride film and a silicon oxynitride film.

11. The semiconductor device according to claim 8, further comprising a transistor formed on the semiconductor substrate and electrically connected to the capacitor.

12. The semiconductor device according to claim 8, wherein the first hydrogen barrier film is selected from an aluminum oxide film, a silicon nitride film and a silicon oxynitride film.

13. The semiconductor device according to claim 8, wherein a dielectric film of the capacitor includes a ferroelectric film.

14. The semiconductor device according to claim 8, wherein the second hydrogen barrier film is formed of an insulating film.

* * * * *